United States Patent [19]
Goronkin et al.

[11] Patent Number: 5,414,274
[45] Date of Patent: May 9, 1995

[54] QUANTUM MULTIFUNCTION TRANSISTOR WITH GATED TUNNELING REGION

[75] Inventors: Herbert Goronkin, Tempe; Saied N. Tehrani, Scottsdale; Jun Shen, Phoenix; Xiaodong T. Zhu, Chandler, all of Ariz.

[73] Assignee: Motorola, Inc., Schaumburg, Ill.

[21] Appl. No.: 96,387

[22] Filed: Jul. 26, 1993

[51] Int. Cl.$^6$ .................. H01L 29/205; H01L 29/88; H01L 29/772
[52] U.S. Cl. .......................... 257/25; 257/20; 257/22; 257/23; 257/24; 257/27; 257/192
[58] Field of Search ................... 257/22–25, 257/27, 192, 20

[56] References Cited
U.S. PATENT DOCUMENTS
5,113,231  5/1992  Söderström ............. 257/25
5,159,421 10/1992  Wolff ...................... 257/22

FOREIGN PATENT DOCUMENTS
63-93160  4/1988  Japan ....................... 257/25

*Primary Examiner*—Jerome Jackson
*Attorney, Agent, or Firm*—Eugene A. Parsons

[57] ABSTRACT

A quantum multifunction transistor including a plurality of conduction layers of semiconductor material with a tunnel barrier layer sandwiched therebetween. The conduction layers each being very thin to form discrete energy levels, and the material being chosen so that discrete energy levels therein are not aligned across the tunnel barrier layer in an equilibrium state. A gate coupled to a portion of one of the conduction layers for aligning, in response to a voltage applied thereto, discrete energy levels in the conduction layers across the tunnel barrier layer, whereby majority carrier current flows through the transistor. Application of a higher voltage to the gate results in minority carrier current flow through the transistor.

17 Claims, 5 Drawing Sheets

5,414,274

QUANTUM MULTIFUNCTION TRANSISTOR WITH GATED TUNNELING REGION

FIELD OF THE INVENTION

The present invention pertains to quantum devices utilizing very thin layers of semiconductor material to form discrete energy levels by the size quantization effect and more specifically to quantum transistors.

BACKGROUND OF THE INVENTION

It has been known for some time that various semiconductor materials can be formed in very thin layers so that energy levels within the material are limited to discrete energy levels. By depositing several very thin layers of different material in overlying relationship, devices, such as light emitting or light sensing diodes, can be formed. An example of such structures is disclosed in U.S. Pat. No. 5,079,601, entitled "Optoelectronic Devices Based on Intraband Transitions in Combinations of Type I and Type II Tunnel Junctions", issued Jan. 7, 1992.

In some instances, attempts have even been made to form several very thin layers of different semiconductor material into three terminal devices, or transistors. One such attempt is disclosed in an article by N. Yokoyama et al., entitled "Resonant-Tunneling Hot Electron Transistor", *Solid-State Electronics*, Vol/.31, No., pp. 577–582, 1988, printed in Great Britain. In the disclosed device, layers of material are formed in vertical overlying relationship to produce a collector on the bottom, an emitter on the top and a base positioned therebetween similar to the well known vertical semiconductor transistor manufactured throughout the world. Because of the vertical positioning, base, emitter and collector connections and terminals are difficult to provide. While there are some differences in operation and while this hot electron transistor is vertically very thin, there is very little improvement in manufacturing difficulty and very little saving in chip real estate.

A second attempt at producing a new transistor is disclosed in an article by M. A. Reed et al., entitled "Realization of a three-terminal resonant tunneling device: The bipolar quantum resonant tunneling transistor", Appl. Phys, Lett., 54 (11), pp 1034–1036, 13 Mar. 1989. In this structure, a quantum well is formed by layers of very thin material and the quantum well is biased as a base of the transistor. This structure is very difficult to realize in a manufacturing scenario and is quite similar to the above described transistor.

SUMMARY OF THE INVENTION

It is a purpose of the present invention to provide a new and improved quantum multifunction transistor.

It is a further purpose of the present invention to provide a new and improved quantum multifunction transistor which is simple to construct.

It is a still further purpose of the present invention to provide a new and improved quantum multifunction transistor which is essentially a horizontal transistor with all connections on a single surface of the supporting substrate and requiring less chip real estate.

It is also a purpose of the present invention to provide new and improved fabrication methods for quantum multifunction transistors.

The above described problems and others are substantially solved and the above purposes and others are realized in a quantum multifunction transistor including a substrate having a surface with a plurality of conduction layers of semiconductor material supported thereon. The conduction layers have at least one tunnel barrier layer sandwiched therebetween and each conduction layer has a thickness so as to form discrete energy levels. Also, the conduction layers are chosen so that discrete energy levels therein are not aligned across the tunnel barrier layer in an equilibrium state. The plurality of conduction layers are formed to define current channels, parallel with the surface of the substrate, with portions of the current channels overlapping to define a gate area. At least one of the portions of the current channels in the gate area have an external gate terminal coupled thereto for aligning discrete energy levels in the plurality of conduction layers across the tunnel barrier layer in response to a voltage applied to the external gate terminal.

The above described problems and others are further substantially solved and the above purposes and others are realized in a method of fabricating a quantum multifunction transistor including the steps of providing a first barrier layer and forming a first conduction layer of semiconductor material with at least a portion of the first conduction layer overlying the first barrier layer. The first conduction layer is formed of semiconductor material having a predetermined bandgap and a predetermined conduction band energy level and with a thickness so as to include discrete energy levels. The next step is to form a tunnel barrier layer of semiconductor material on the first conduction layer. The tunnel barrier layer is formed of semiconductor material having a bandgap which is wider than the predetermined bandgap of the first conduction layer and with a thickness to allow carriers to tunnel therethrough. Portions of the first conduction layer are modified to define and isolate a current channel therein. A second conduction layer of semiconductor material is formed on the tunnel barrier layer. The second conduction layer is formed of semiconductor material having a predetermined bandgap and a valence band energy level higher than the predetermined conduction band energy level of the semiconductor material of the first conduction layer and with a thickness so as to include discrete energy levels. The first conduction layer and the second conduction layer are chosen so that discrete energy levels therein are not aligned across the tunnel barrier layer in an equilibrium state. A second barrier layer is formed in overlying relationship to the second conduction layer. Portions of the second conduction layer are modified to define and isolate a current channel therein and so that only a portion of the current channel therein overlies the current channel defined in the first conduction layer. An external gate terminal is formed on the portion of the current channel in the second barrier layer overlying the portion of the current channel in the second conduction layer. The second barrier layer is formed with a thickness that allows voltages applied to the external gate terminal to be coupled to the portion of the current channel in the second conduction layer through the second barrier layer.

BRIEF DESCRIPTION OF THE DRAWINGS

Referring to the drawings.

DESCRIPTION OF THE PREFERRED EMBODIMENTS

Figure 1:
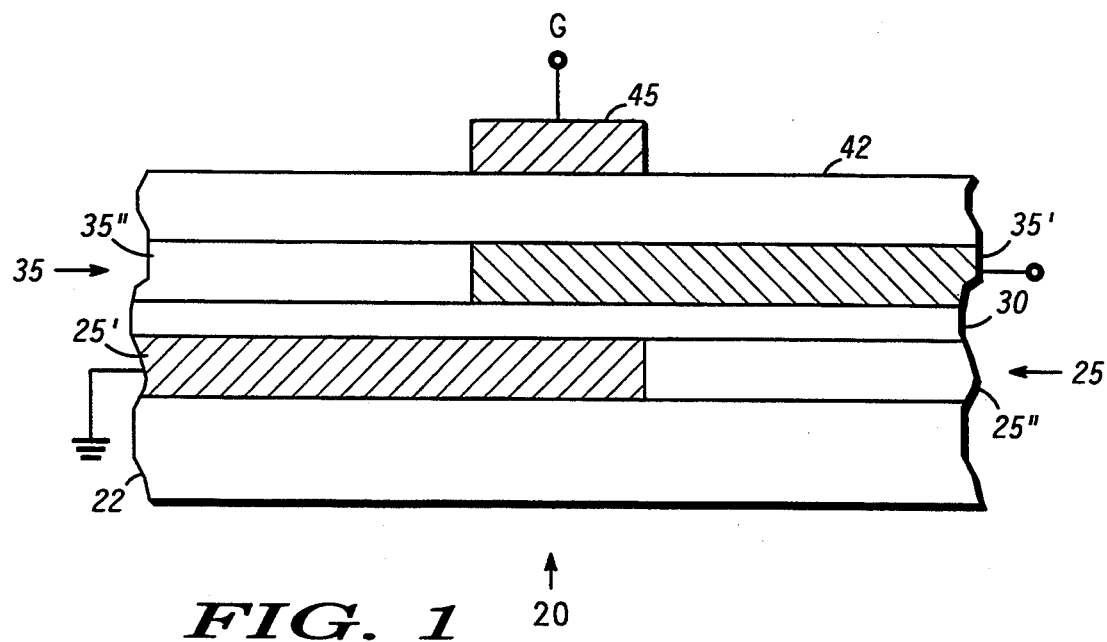
FIG.1 is a cross-sectional view of a quantum multifunctional transistor embodying the present invention.
Figure 2:
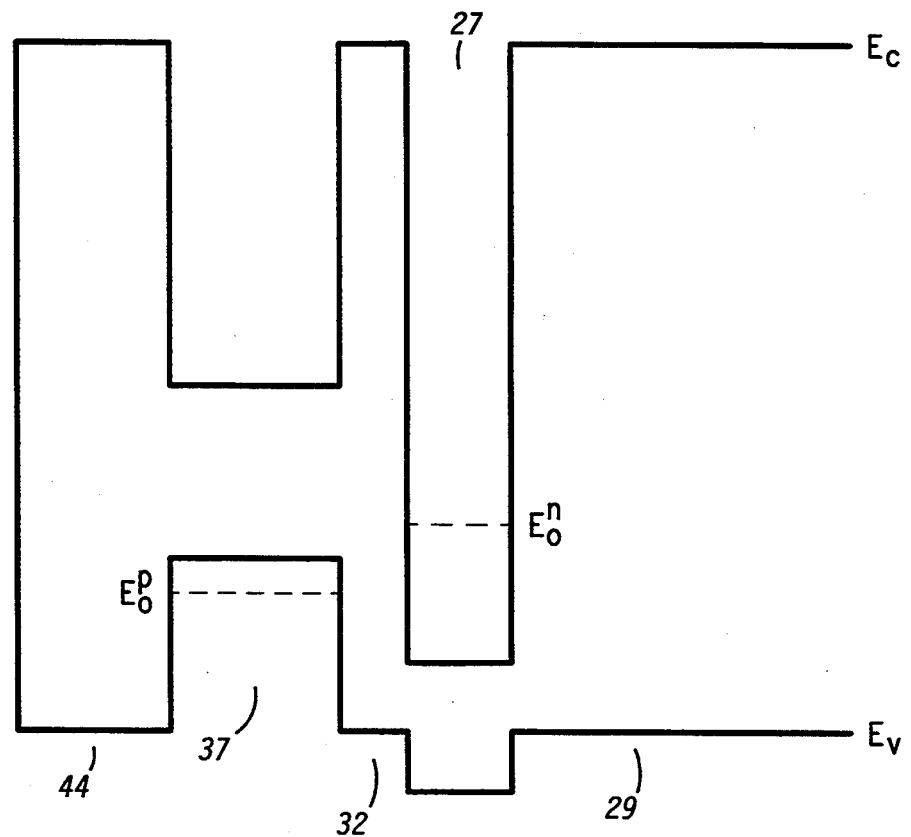
FIG.2 is an energy level diagram of the transistor of FIG. 1.

Referring specifically to FIGS. 1 and 2, a cross-sectional view of a transistor 20 embodying the present invention and an energy level diagram, respectively, are illustrated. Transistor 20 is formed on a supporting substrate 22 having an upper surface 23. A first conduction layer 25 of semiconductor material is positioned on surface 23 of substrate 22. First conduction layer 25 is made very thin in order to form discrete energy levels therein by the size quantization effect. For example, first conduction layer 25 is a layer of InAs less than approximately 100 Å thick. The bandgap and energy level for first conduction layer 25 is illustrated in FIG. 2 at 27. As is well understood in the art, the upper line Ec in FIG. 2 represents the lower edge of the conduction band and the lower line Ev represents the upper edge of the valence band, with the space therebetween representing the bandgap. Further, at least one discrete energy level in the conduction band of first conduction layer 25 is represented by ground state $E_0^n$.

Here it should be noted that substrate 22 is selected to form a buffer or barrier to the movement, or tunneling, of carriers into substrate 22. Substrate 22 is generally formed of material, or has a layer of material on the upper surface thereof, with a bandgap wider than the bandgap of the material forming layer 25. Typical materials used to form all, or part of, substrate 22 are AlAs, AlSb, AlGaSb, or the like. The bandgap and energy level for substrate 22 is illustrated in FIG. 2 at 29. It should be noted that relative to the thicknesses of the other layers in FIG. 2, the thickness of substrate 22 is unlimited.

A portion of first conduction layer 25, designated 25" is etched away, damaged, or doped to render portion 25" a relatively poor electrical conductor. The remaining portion of first conduction layer 25 is a relatively good electrical conductor and defines a current path, designated 25', which in this specific embodiment is the source terminal of transistor 20. Only current path 25' is represented by the bandgap and energy level at 27 in FIG. 2.

A tunnel barrier layer 30 of semiconductor material is formed on first conduction layer 25. Tunnel barrier layer 30 has a bandgap which is wider than the predetermined bandgap of first conduction layer 25 so as to act like an insulator, and tunnel barrier layer 30 is sufficiently thin to allow carriers to tunnel therethrough. In this specific embodiment, tunnel barrier layer 30 is formed of AlAs, AlSb, or the like with a thickness less than approximately 50 Å and preferably in the range of 15 Å to 25 Å. The bandgap and energy levels of tunnel barrier layer 30 are illustrated in FIG. 2 at 32.

A second conduction layer 35 of semiconductor material is positioned in overlying relationship on tunnel barrier layer 30 so as to sandwich tunnel barrier layer 30 between first and second conduction layers 25 and 35. Second conduction layer 35 is made very thin in order to form discrete energy levels therein by the size quantization effect. The bandgap and energy levels for second conduction layer 35 are illustrated in FIG. 2 at 37. At least one discrete energy level in the valence band of second conduction layer 35 is represented by ground state $E_0^p$. Second conduction layer 35 has a bandgap narrower than the bandgap of tunnel barrier layer 30 and first and second conduction layers 25 and 35 are chosen so that discrete energy levels $E_0^n$ and $E_0^p$ therein are not aligned across tunnel barrier layer 30 in an equilibrium state (illustrated in FIG. 2). In this specific embodiment, second conduction layer 35 is a layer of GaSb less than approximately 100 Å thick, and preferably approximately in the range of 50–70 Å thick.

A portion of second conduction layer 35, designated 35", is etched away, damaged, or doped to render portion 35" a relatively poor electrical conductor. The remaining portion of second conduction layer 35 is a relatively good electrical conductor and defines a current path, designated 35', which in this specific embodiment is the drain terminal of transistor 20. Only current path 35' is represented by the bandgap and energy level at 37 in FIG. 2. Current path 35' is positioned so that a portion near the inner end thereof overlaps, or overlies, a portion of current path 25' near the inner end thereof. The overlapping portions of current paths 25' and 35' define a gate region or area 40 (generally outlined by broken lines in FIG. 4).

A final barrier layer 42 of semiconductor material is formed on second conduction layer 35. An external gate terminal 45 is positioned on barrier layer 42 in overlying relationship to gate area 40. Barrier layer 42 has a bandgap which is wider than the predetermined bandgap of second conduction layer 35 so as to act like an insulator and prevent the tunneling of carriers therethrough to gate terminal 45. Further, the thickness of barrier layer 42 must be sufficient to electrically insulate gate terminal 45 from current path 35' while allowing potentials, or gate voltages, applied to gate terminal 45 to be coupled to current path 35'. In this specific embodiment, barrier layer 42 is formed of AlAs, AlSb, or the like with a thickness of approximately 200 Å. The bandgap and energy levels of barrier layer 42 are illustrated in FIG. 2 at 44.

Figure 3:
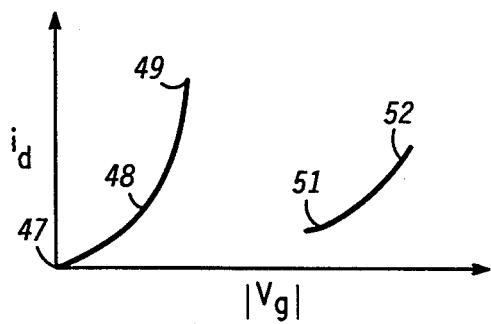
FIG. 3 is a graphical representation of drain current relative to gate voltage in the transistor of FIG. 1.

In the operation of transistor 20 of FIGS. 1 and 2, and referring also to FIG. 3, for a fixed small drain bias $V_d$, when zero voltage is applied to gate terminal 45 discrete energy levels $E_0^n$ and $E_0^p$ remain misaligned and little current ($i_d$) flows through current paths 25' and 35'. This situation is represented by point 47 on the $i_d$ curve in FIG. 3. With Vg<0, as $|V_g|$ increases further, $E_0^p$ aligns with $E_0^n$ and $i_d$ current flows in current paths 25' and 35', as illustrated by curve 48 to 49 in FIG. 3. In other words, the two channels are physically separated, but they can be electrically connected by applying an appropriate gate bias which allows tunneling. As $|V_g|$ increases, discrete energy levels $E_0^n$ and $E_0^p$ fall out of alignment and $i_d$ current flowing in current paths 25' and 35' decreases, as illustrated by curve 51 to 52. The discontinuity and subsequent rise of $i_d$ current are results of removing the $E_0^n$ and $E_0^p$ resonance followed by generation of leakage current. In the specific embodiment illustrated, when $E_0^n$ and $E_0^p$ are aligned, electrons flow from the conduction band in the InAs to the empty quantized state in the valence band in the GaSb. Electrons are continuously supplied by the source and are collected by the drain.

Figure 4:
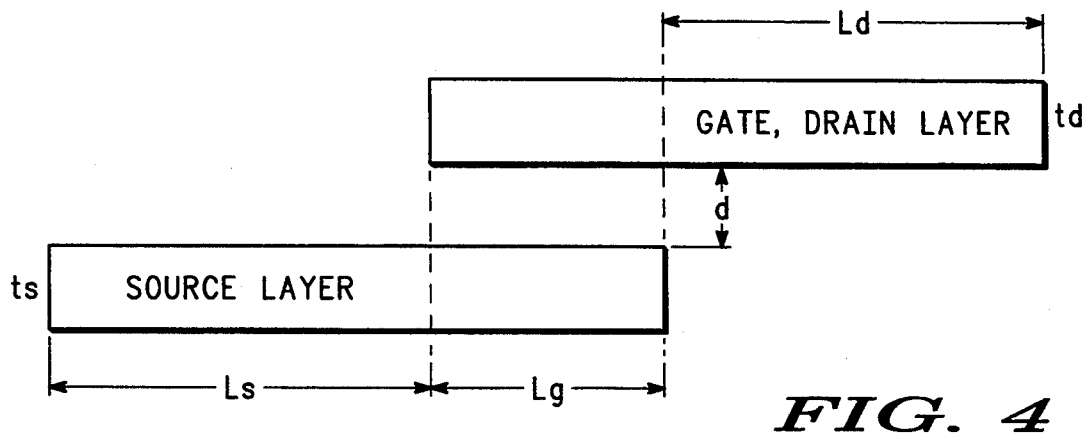
FIG. 4 is a simplified cross-sectional view of the transistor of FIG. 1, illustrating the relative dimensions thereof.

Current channel 25', which in this embodiment is InAs, is used as the source because the electron mobility is as high as 33,000 cm²/V-s and the source resistance, $R_s$, is low. Referring to FIG. 4, if the width of transistor 20 is z, $$R_S = \frac{L_s}{q n \mu_n z t_s}$$

where $n = n_s/t_s$.

The drain resistance is $$R_d = \frac{L_d}{q \mu_p p_s z t_d}$$

where $P_s$ and $n_s$ are hole and electron concentrations, respectively, and $t_s$ and $t_d$ are the thicknesses of the source and drain channels, respectively. For example, if $p_s = n_s = 1.2 \times 10^{12}$ cm$^{-2}$, $\mu_n = 20,000$, $\mu_p = 500$, $L_s = L_d = 1 \mu$m, then $R_s = 52\Omega$ and $R_d = 2080\Omega$ for $z = 5$ $\mu$m. In this specific example, the $R_s$ value is acceptable but the $R_d$ value is large and will result in current reduction. However, if Ld is reduced to 0.1 $\mu$m using self aligned processing, Rd drops to 208$\Omega$ and the current increases.

The limiting parasitic factor is the low mobility of the GaSb forming layer 35'. If the materials are reversed and the GaSb is used for the source instead of the drain, it can be shown that the current flow will be better but the voltage required to operate the device will be too high. It has been found that both of these problems can be substantially alleviated by increasing the doping of the GaSb. In the above calculations, $P_s$ was assumed to be $1.2 \times 10^{12}$. However, if the GaSb gate channel is doped to $10^{13}$ or $10^{14}$ cm$^{-2}$, the results are much better. For GaSb as the source (layer 25'), $R_s$ approaches 20$\Omega$ for $10^{13}$ cm$^{-2}$ and 2$\Omega$ for $10^{14}$ cm$^{-2}$. (pertaining to the self aligned gate structure). For $R_s = 20\Omega$, the loss of transconductance is 18% while for $R_s = 2\Omega$, the loss is 2.2%, using $g_m' = g_m/(1 + g_m R_s)$.

Figure 5:
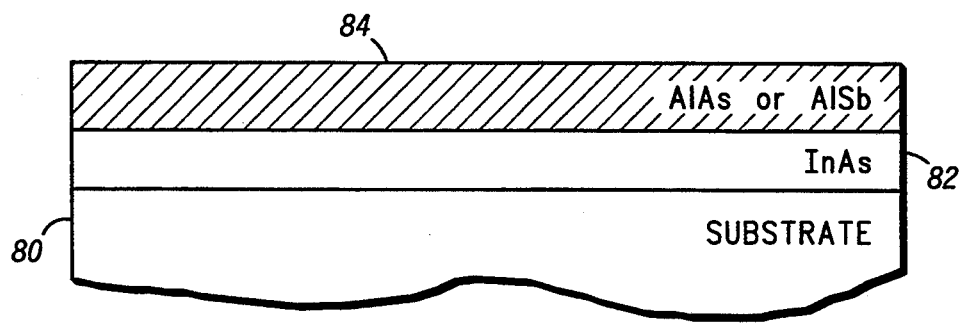
FIGS. 5-9 are sequential cross-sectional views of various steps performed in a fabrication of the transistor of FIG. 1.
Figure 6:
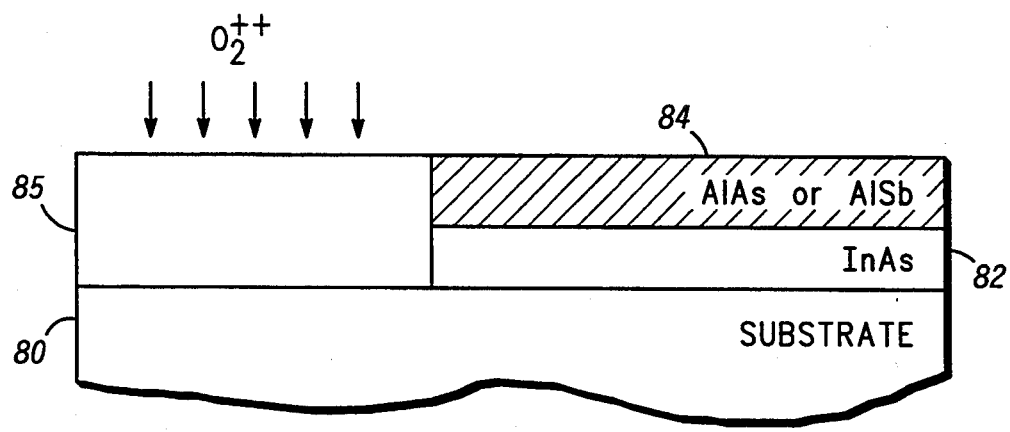
Figure 7:
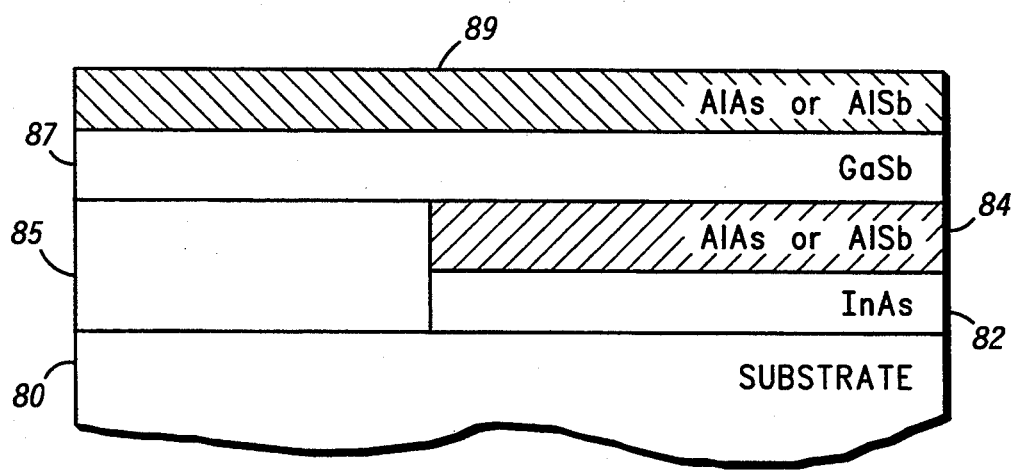
Figure 8:
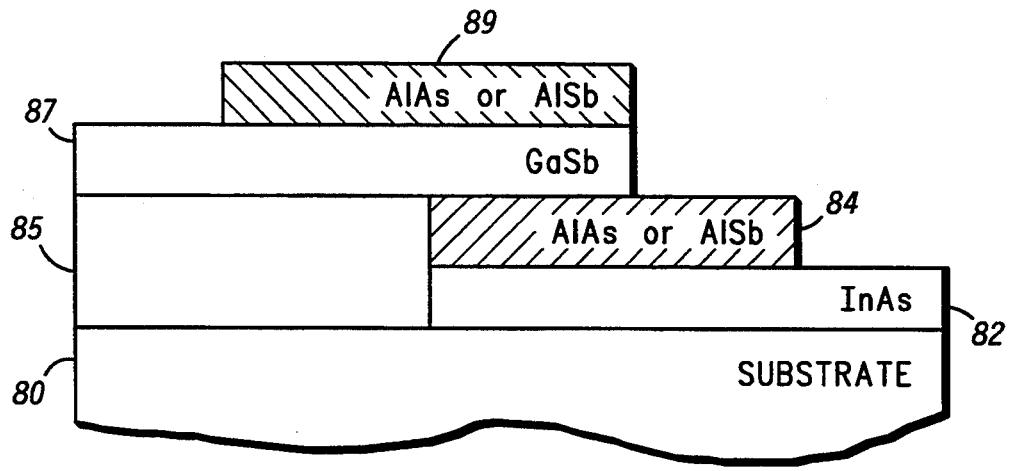
Figure 9:
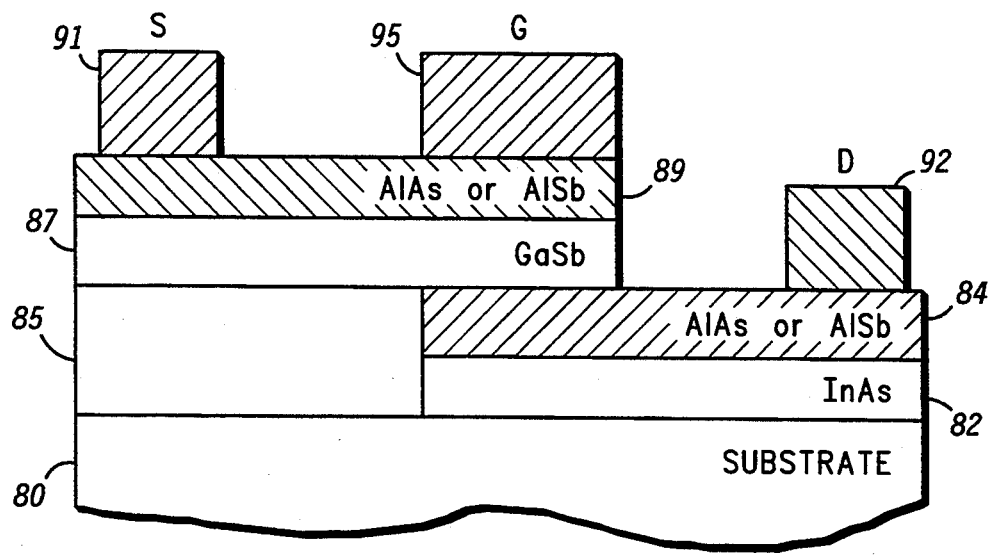

Referring to FIGS. 5–9, a specific method of fabricating a transistor similar to the transistor of FIG. 1 is illustrated. A suitable substrate 80 is provided, which either will act as a buffer or which has a barrier layer formed on the surface thereof. A layer 82 of InAs, less than approximately 200 Å thick is grown on the surface of substrate 80. A tunnel barrier layer 84 of AlAs or AlSb, less than approximately 100 Å thick, is grown on the surface of layer 82, as illustrated in FIG. 5. An oxygen implant is used to damage and/or dope exterior regions 85 of layers 82 and 84 to define and isolate the drain current channel in layer 82, as illustrated in FIG. 6. A layer 87 of GaSb, less than approximately 200 Å thick, is grown on the surface of layer 84 and an insulating layer 89 is grown on the surface of layer 87, as illustrated in FIG. 7. Insulating layer 89 is formed of AlAs or AlSb and is approximately 200 Å thick. Layer 89 is etched to define and isolate a source current channel as illustrated in FIG. 8. Further, layers 84 and 89 are etched to provide a surface area on layers 82 and 87, respectively, for the positioning of external current terminals. Metallized source and drain current terminals 91 and 92 are deposited on the exposed surfaces of layers 87 and 82, respectively, as illustrated in FIG. 9. A metallized gate terminal 95 is formed on the surface of layer 89 in overlying relationship to the gate region, which gate region is defined by the overlying areas of layers 87 and 82.

Figure 10:
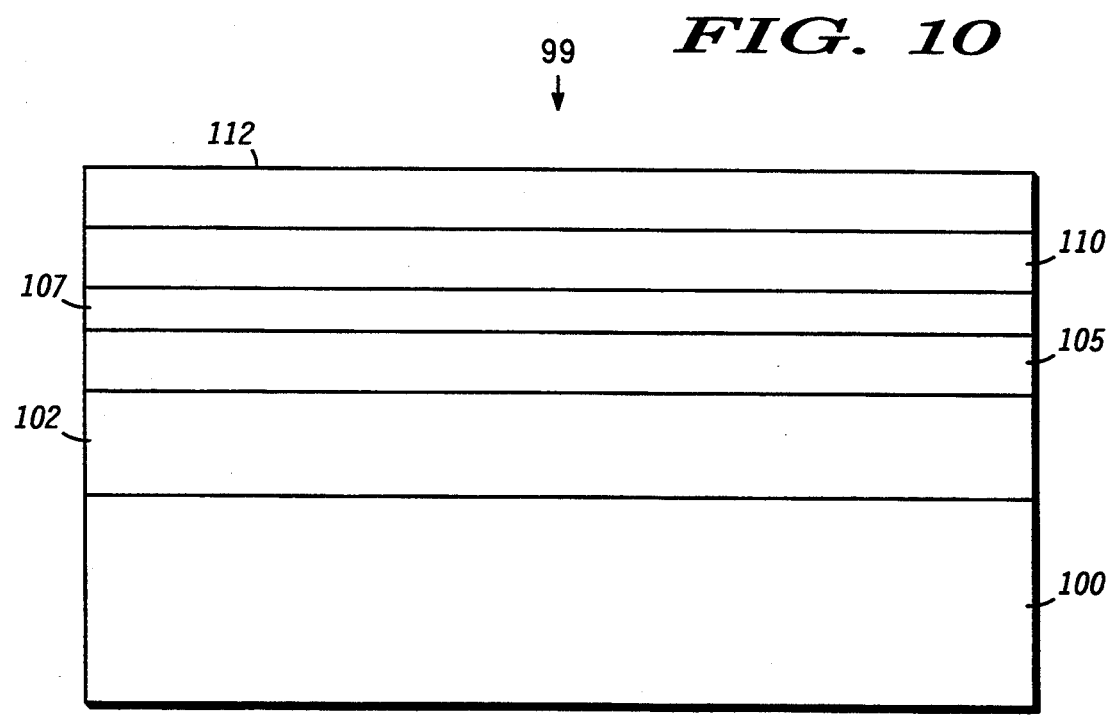
FIGS. 10 and 11 illustrate two steps in another method of fabricating a transistor similar to the transistor of FIG. 1.
Figure 11:
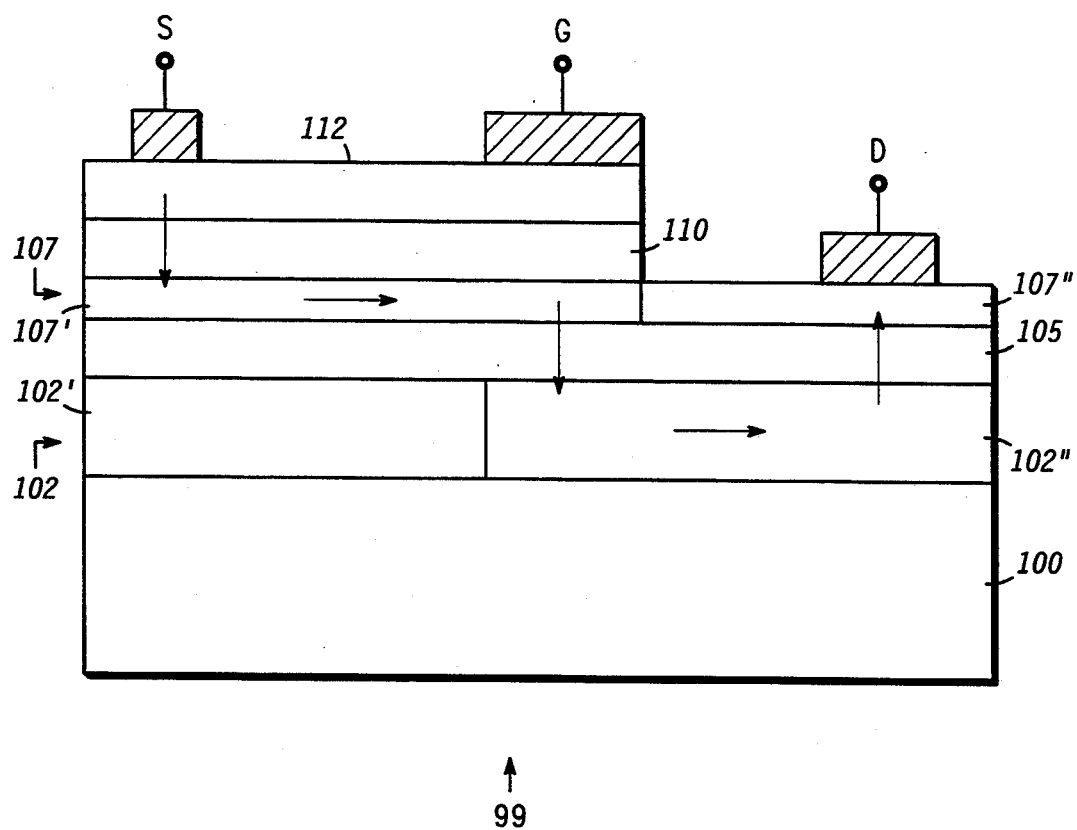

FIGS. 10 and 11 illustrate two steps in another method of fabricating a transistor 99 similar to the transistor illustrated in FIG. 1. Referring specifically to FIG. 10, a suitable substrate 100 is provided, which acts as a buffer or which has a barrier layer formed on the surface thereof. A layer 102 of GaSb, less than approximately 200 Å thick is grown on the surface of substrate 100. A tunnel barrier 105 of AlAs or AlSb, less than approximately 100 Å thick, is grown on the surface of layer 102. A layer 107 of InAs, less than approximately 200 Å thick, is grown on the surface of tunnel barrier 105 and a barrier layer 110 is grown on the surface of layer 107. A layer 112 of GaSb, less than approximately 100 Å thick is then grown to cap buffer or barrier layer 110, as illustrated in FIG. 10.

Referring to FIG. 11, gate metal 114 is defined, by patterning or deposition and selective etching, on the top surface of layer 112. A drain region is then defined by selectively etching layers 112 and 110, stopping at layer 107, using gate metal 114 as a mask. Gate metal 114 is then etched to electrically separate a source portion 115 from the gate portion, which is designated 114 in FIG. 11. A metallized drain terminal is then deposited on the exposed surface of layer 107 in a separate step. Alternatively, metallized source and drain terminals 115 and 116 may be placed as illustrated in FIG. 11 by a separate metallization step, or steps. In FIG. 11, layers 107 and 102 have been divided into areas 107' and 107" and 102' and 102", respectively, to indicate the effects of appropriate voltages on terminals 114, 115 and 116 and to aid in the description of the operation.

The operation of transistor 99 is generally as follows. In area 107" generally beneath drain terminal 116, the Fermi level is pinned at approximately 130 meV above the conduction band of InAs (layer 107), resulting in a high concentration of holes in area 102" in layer 102. In the source region, the area generally below terminal 115 and exposed surface regions, the Fermi level is pinned to the GaSb/AlSb level approximately 850 meV below the AlSb conduction band. In this embodiment, a high concentration of electrons exists in area 107'. In transistor 99, electrons are injected from terminal 115 and travel laterally in area 107' where they must tunnel into area 102" under gate terminal 114. The tunneling current is controlled by the combination of voltages applied to gate and drain terminals 114 and 116, respectively. The electrons are then collected by drain terminal 116. Transistor 99 utilizes the Fermi level pinning to control the charge density in the underlying layers in order to realize a quantum functional device.

Thus, a new and improved quantum multifunction transistor is disclosed which is relatively simple to construct because it is essentially a horizontal transistor with all connections on a single surface of the supporting substrate. While the source and drain of the examples utilized have been illustrated and explained in a specific position, it will be understood that the source and drain could be reversed, if desired. Further, because an essentially horizontal transistor is disclosed with all of the external contacts on the same side of the substrate, the transistor requires less chip real estate and is easier to use in associated circuitry. Also, because of the novel structure, new and improved fabrication methods for quantum multifunction transistors are disclosed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A quantum multifunction transistor comprising:
a substrate having a surface;
a pair of conduction layers of semiconductor material supported on the surface of the substrate and having at least one tunnel barrier layer sandwiched therebetween, the pair of conduction layers each having a thickness so as to form a discrete energy level in each conduction layer, one energy level being in the conduction band and one energy level being in the valence band, and the plurality of conduction layers of semiconductor material being chosen so that the discrete energy levels therein are not aligned across the tunnel barrier layer in an equilibrium state;
the plurality of conduction layers further being formed to define current channels, parallel with the surface of the substrate, with the current channels being non-overlapping except for portions of the current channels overlapping only in a defined gate area; and
at least one of the portions of the current channels in the plurality of conduction layers having an external gate terminal coupled thereto for aligning the discrete energy levels in the plurality of conduction layers across the tunnel barrier layer in response to a voltage applied to the external gate terminal.

2. A quantum multifunction transistor as claimed in claim 1 including in addition first and second external current terminals each coupled to two different current channels in the plurality of conduction layers, the external gate terminal and the first and second external current terminals all being supported on the surface of the substrate.

3. A quantum multifunction transistor as claimed in claim 2 wherein the first external current terminal is coupled to the same one of the current channels in the plurality of conduction layers as the external gate terminal, the second external current terminal being coupled to a current channel of the one of the plurality of conduction layers other than the current channel having the external gate terminal coupled thereto.

4. A quantum multifunction transistor as claimed in claim 2 wherein the first and second external current terminals are each coupled to layers of the plurality of conduction layers different from each other and different from the layer to which the external gate terminal is coupled.

5. A quantum multifunction transistor as claimed in claim 1 wherein the plurality of conduction layers of semiconductor material are chosen so that the external gate terminal aligns discrete energy levels in the plurality of conduction layers across the tunnel barrier layer in response to a first voltage applied to the external gate terminal to provide a current of majority carriers through the transistor and misaligns discrete energy levels in the plurality of conduction layers across the tunnel barrier layer in response to a second voltage, higher than the first voltage, applied to the external gate terminal to provide a leakage current through the transistor.

6. A quantum multifunction transistor comprising:
a first barrier layer;
a first conduction layer of semiconductor material having a predetermined bandgap and a predetermined conduction band energy level, the first conduction layer having a thickness so as to form a discrete energy level in the conduction band, at least a portion of the first conduction layer overlying the first barrier layer;
a second conduction layer of semiconductor material having a predetermined bandgap and a valence band energy level higher than the predetermined conduction band energy level of the first conduction layer, the second conduction layer having a thickness so as to form a discrete energy level in the valence band;
a tunnel barrier layer of semiconductor material sandwiched between the portion of the first conduction layer overlying the first barrier layer and a portion of the second conduction layer, the tunnel barrier layer having a bandgap which is wider than the predetermined bandgaps of the first and second conduction layers and a thickness to allow carriers to tunnel therethrough, and the portions of the first and second conduction layers being positioned in overlapping relationship with the remainder Of the first and second conduction layers being non-overlapping;
the first conduction layer of semiconductor material and the second conduction layer of semiconductor material being chosen so that the discrete energy levels therein are not aligned across the tunnel barrier layer in an equilibrium state;
a second barrier layer positioned in overlying relationship to at least the portion of the second conduction layer; and
an external gate terminal positioned on the second barrier layer in overlying relationship to the portion of the second conduction layer and coupled to the portion of the second conduction layer through the second barrier layer.

7. A quantum multifunction transistor as claimed in claim 6 wherein the external gate terminal coupled to the portion of the second conduction layer aligns the discrete energy levels in the plurality of conduction layers across the tunnel barrier layer in response to a first voltage applied to the external gate terminal to provide interband tunneling conduction.

8. A quantum multifunction transistor as claimed in claim 7 wherein the first and second conduction layers of semiconductor material are chosen so that the external gate terminal aligns the discrete energy levels in the first and second conduction layers across the tunnel barrier layer in response to a first voltage applied to the external gate terminal to provide a current of majority carriers through the transistor and misaligns the discrete energy levels in the first and second conduction layers across the tunnel barrier layer in response to a second voltage, higher than the first voltage, applied to the external gate terminal to provide a leakage current through the transistor.

9. A quantum multifunction transistor as claimed in claim 6 including in addition first and second current terminals connected to the first and second conduction layers, respectively.

10. A quantum multifunction transistor as claimed in claim 7 wherein the first conduction layer forms the source of the transistor and the second conduction layer forms the drain.

11. A quantum multifunction transistor as claimed in claim 6 wherein the first and second conduction layers of semiconductor material include InAs and GaSb, respectively.

12. A quantum multifunction transistor as claimed in claim 11 wherein the first and second conduction layers are each less than approximately 100 Å thick.

13. A quantum multifunction transistor as claimed in claim 12 wherein the tunnel barrier layer includes one of AlSb and AlAs.

14. A quantum multifunction transistor as claimed in claim 13 wherein the tunnel barrier layer is less than approximately 25 Å thick.

15. A quantum multifunction transistor as claimed in claim 14 wherein the first and second barrier layers of semiconductor material each include one of AlSb and AlAs.

16. A quantum multifunction transistor as claimed in claim 14 wherein the second barrier layer is less than approximately 200 Å thick.

17. A quantum multifunction transistor as claimed in claim 16 including in addition a substrate with the first barrier layer positioned thereon.

* * * * *